US006835611B1

(12) United States Patent
Tsui et al.

(10) Patent No.: US 6,835,611 B1
(45) Date of Patent: Dec. 28, 2004

(54) STRUCTURE OF METAL OXIDE SEMICONDUCTOR FIELD EFFECT TRANSISTOR

(75) Inventors: Bing-Yue Tsui, Hsinchu (TW); Chih-Feng Huang, Fusing Township, Changhua County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/625,516

(22) Filed: Jul. 24, 2003

(51) Int. Cl.⁷ .................... H01L 21/336; H01L 21/8234
(52) U.S. Cl. ...................................................... 438/197
(58) Field of Search .......................... 438/197, 229–232

(56) References Cited

U.S. PATENT DOCUMENTS 6,440,806 B1 * 8/2002 Xiang ......................... 438/290

OTHER PUBLICATIONS

Streetman, Solid State Electronic Devices, 1990, Prentice–Hall, Inc., Third Edition, pp. 351–352.*
C.J. Koeneke, et al.; "Schottky MOSFET for VLSI"; in Dig. of IEDM, p. 367; 1981.
S.E. Swirhun et al.; "A VLSI Suitable Schottky Barrier CMOS Process"; IEEE, Trans. Electron Devices; vol. ED–32, No. 2; p. 194; 1985.
B.Y. Tsui et al.; "A Novel Process For High–Performance Schottky Barrier PMOS"; J. Electrochem. Soc.; vol. 136, No. 5; p. 1456; 1989.
C. Wang et al.; "Sub–50–nm PtSi Schottky Source/Drain p–MOSFETs"; in Proc. of Device Research Conf.; p/72; 1998.

C. Wang et al.; Sub–50–nm PtSi Schotty Source/Drain Metal–Oxide–Semiconductor Field–Effect Transistors; Appl. Phys. Lett.; vol. 74, No. 8; p. 1174; 1999.
W. Saltoh et al.; "35 nm Metal Gate SOI–p–MOSFETs With PtSi Schottky Source/Drain"; In Proc. of Device Research Conf.; p. 30; 1999.
A. Itoh et al.; "Very Short Channel Metal–Gate Schottky Source/Drain SOI–PMOSFETs And Their Short Channel Effect"; In Proc. of Device Research Conf.; p. 77; 2000.
H.C. Lin et al.; "A Novel Implantless MOS Thin–Film Transistor With Simple Processing, Excellent Performance, and Ambipolar Operation Capability"; in Dig. of IEDM; p. 857; 2000.
K. Uchida et al.; "Enhancement Of Hot–Electron Generation Rate in Schottky Source Metal–Oxide–Semiconductor Field–Effect Transistors"; Appl. Phys. Lett.; vol. 76, No. 26; p. 3992; 2000.

* cited by examiner

Primary Examiner—Craig A. Thompson
(74) Attorney, Agent, or Firm—Troxell Law Office PLLC

(57) ABSTRACT

The present invention provides a structure of Metal Oxide Semiconductor Field Effect Transistor (MOSFET), which comprises a SOI (Silicon-On-Insulator) device, a MOS (Metal Oxide Semiconductor) formed on said SOI device, and a metal-silicide layer. Said SOI device includes a substrate, an insulation layer formed on said substrate, and a silicon layer formed on said insulation layer, and the MOS is formed on said SOI device. The metal-silicide layer is formed in accordance with a metal aligned process by a metal layer being deposited on said SOI device and on said MOS for reacting with said silicon layer, and an implant-to-silicide process is employed to form a high-density source region and a high-density drain region for modifying Schottky Barrier and diminishing Carrier Injection Resistance.

7 Claims, 7 Drawing Sheets

STRUCTURE OF METAL OXIDE SEMICONDUCTOR FIELD EFFECT TRANSISTOR

REFERENCE CITED

1. C. J. Koeneke, et. al., "Schottky MOSFET for VLSI", in Dig. of IEDM, p.367, 1981.
2. S. E. Swirhun, et. al., "A VLSI suitable Schottky barrier CMOS process", IEEE, Trans. Electron Devices, vol.ED-32, No.2, p.194, 1985.
3. B. Y. Tsui, et. al., "A novel process for high-Performance Schottky barrier PMOS", J. Electrochem. Soc., vol. 136, No.5, p.1456, 1989.
4. C. Wang, et. al., "Sub-50-nm PtSi Schottky source/drain p-MOSFETs", in Proc. of Device Research Conf., p.72, 1998.
5. C. Wang, et. al., "Sub-40 nm PtSi Schottky source/drain metal-oxide-semiconductor field-effect transistors", Appl. Phys. Lett., vol.74, No.8, p.1174, 1999.
6. W. Saitoh, et. al., "35 nm metal gate SOI-pMOSFETs with PtSi Schottky source/drain", in Proc. of Device Research Conf., p.30, 1999.
7. A. Itoh, et. al., Very short channel metal-gate Schottky source/drain SOI-PMOSFETs and their short channel effect", in Proc. of Device Research Conf., p.77, 2000.
8. H. C. Lin, et. al., "A novel implantless MOS Thin-Film Transistor with simple processing, excellent performance, and ambipolar operation capablity". in Dig. of IEDM, p.857, 2000.
9. K. Uchida, et. al., "Enhancement of hot-electron generation rate in Schottky source metal-oxide-semiconductor field-effect transistors", Appl. Phys. Lett., vol.76, No.26, p.3992, 2000.

FIELD OF THE INVENTION

The present invention relates to MOSFET (Metal Oxide Semiconductor Field Effect Transistor) for modifying Schottky Barrier and diminishing Carrier Injection Resistance. More particularly, the present invention employs SOI (Silicon-On-Insulator) device to be a substrate thereof for modifying Schottky Barrier and diminishing Carrier Injection Resistance, and a fabrication process therefor.

BACKGROUND OF THE INVENTION

The MOSFET industry has been working on downscaling for microelectronic devices, particularly for the MOSFET, to increase its features and the density of component. It is very successful in some examples from the early micron till today's deep-submicron for MOSFET, however, it still has some problems for downscaling to nanomicron. Especially, the short channel effect is a very important problem, which is caused by crosswise dopant diffusion; after ion implanting in source and drain electrodes, annealing process may cause the crosswise dopant diffusion.

Lately, the structure of Schottky Barrier has been put in use on nanomicron SOI device. Metal silicide may replace the P-N junction without causing dopant diffusion; therefore, it may solve the problem of short channel effect. The structure of Schottky Barrier has been provided in 10 years ago for improving the latch-up problem, but it also caused high carriers injection resistance in source electrode and high current leakage in drain electrode of Schottky Barrier. Though an asymmetric structure has been provided for solving the problem of current leakage, it could not be accepted by CMOS process due to the different mask process for masking the source region, and the resistance problem still not be solved.

The structure of Schottky Barrier being employed on SOI device may improve the current leakage in drain electrode. Because after forming metal silicide the silicon layer is reacted completely, the area of Schottky Junction is squeezed in the channel for carriers passing through, and the current leakage problem may be improved dramatically. However, the problem of carrier injection resistance is still not solved. Besides, due to the different density channel of N-MOSFET and P-MOSFET respectively, it is necessary to have different metal-silicide for modifying Schottky Barrier, for example, PtSi adapted for P-MOSFET and $ErSi_2$ for N-MOSFET. Therefore, it may not be available for integrating into the standard MOS process with different materials.

Furthermore, "Sub-gate" has been provided to form "inversion layers" for generating a channel for carriers passing through; however, this kind of process is not accepted for the standard CMOS process, and also, the problem of employing different material is not solved. In addition, it needs high voltage to control the sub-gate, and it also may cause another problem in voltage control.

SUMMARY OF THE INVENTION

Accordingly, the present invention discloses a structure of MOSFET for modifying the Schottky Barrier and diminishing carrier Injection Resistance and method for fabricating the same, which comprises a SOI (Silicon-On-Insulator) device, a MOS (Metal Oxide Semiconductor) formed on said SOI device, and a metal-silicide layer. Said SOI device includes a substrate, an insulation layer formed on said substrate, and a silicon layer formed on said insulation layer. Said MOS is formed on said SOI device. The metal-silicide layer is formed in accordance with a metal self aligned process by a metal layer being deposited on said SOI device and on said MOS for reacting with said silicon layer, and an implant-to-silicide process is employed to form a high-density source region and a high-density drain region for modifying Schottky Barrier and diminishing Carrier Injection Resistance.

BRIEF DESCRIPTION OF THE DRAWINGS

The present invention will be better understood from the following detailed description of preferred embodiments of the invention, taken in conjunction with the accompanying drawings, in which

FIG. 3~FIG. 7 are schematic cross sections of the essential portion illustrating a process for manufacturing the MOSFET according to the

DESCRIPTION OF THE PREFERRED EMBODIMENTS

The following descriptions of the preferred embodiments are provided to understand the features and the structures of the present invention.

Figure 1:
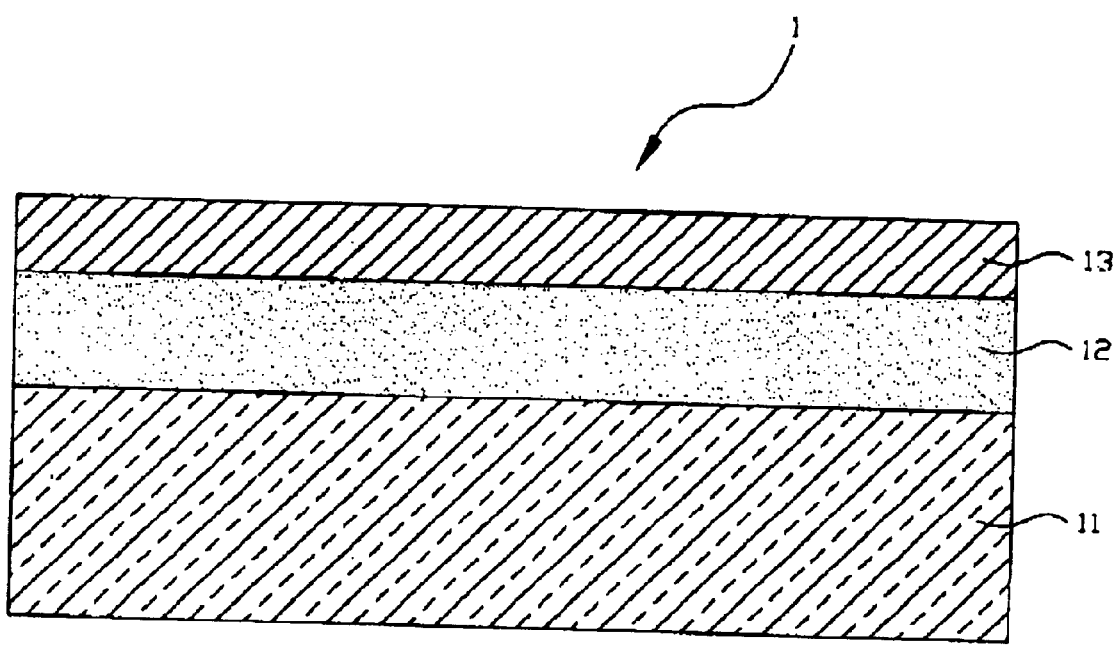
FIG. 1 is a schematic cross section of a SOI device.
Figure 2:
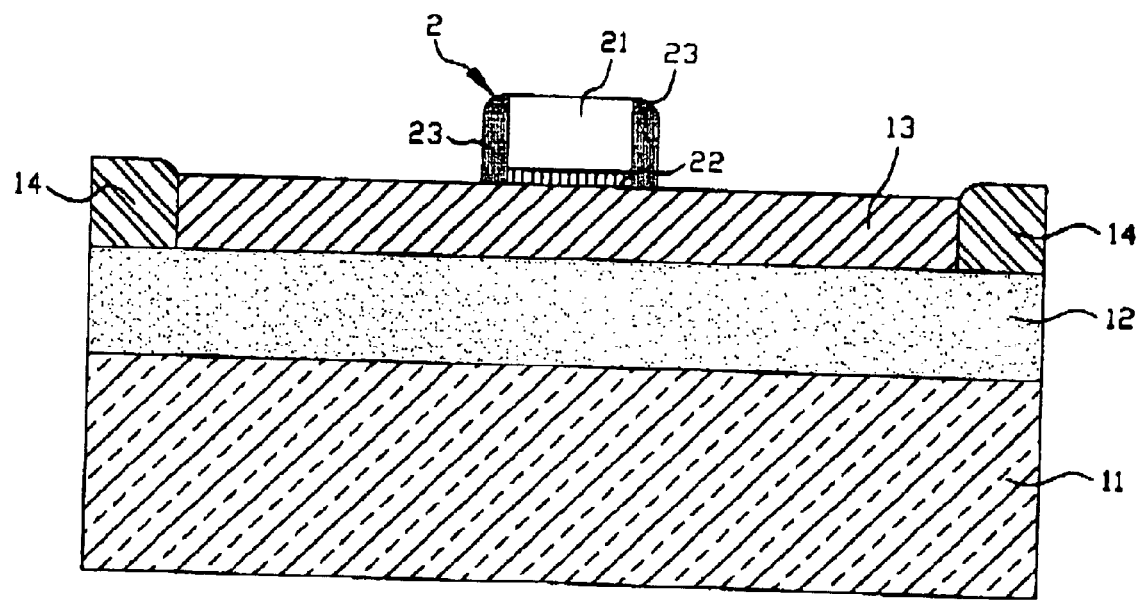
FIG. 2 is a schematic cross section of a MOS formed on the SOI device.

Please referring to the FIG. 1 of a schematic cross section of a SOI device, it shows a SOI device 1 formed by a SOI process to be the substrate of the present invention. The SOI device 1 includes a substrate 11, an insulation layer 12 formed on said substrate 11, and a silicon layer 13 formed on said insulation layer 12; wherein said substrate 11 may be a silicon substrate or a glass substrate, and said insulation layer 12 may be an oxide layer. Next, please seeing the FIG. 2, the isolation area 14 is formed by a general isolation process. Then the process of dielectric oxidization or deposition, gate deposition, photolithography, and etching forms the gate isolation layer 22 and gate electrode 21. After that, depositing a dielectric isolation layer and adapting an anisotropic etching process, the spacers 23 will be formed. Thus, a MOS 2 is Formed on said SOI device 1; wherein said MOS is selected from one of a P-MOS or an N-MOS.

Figure 3:
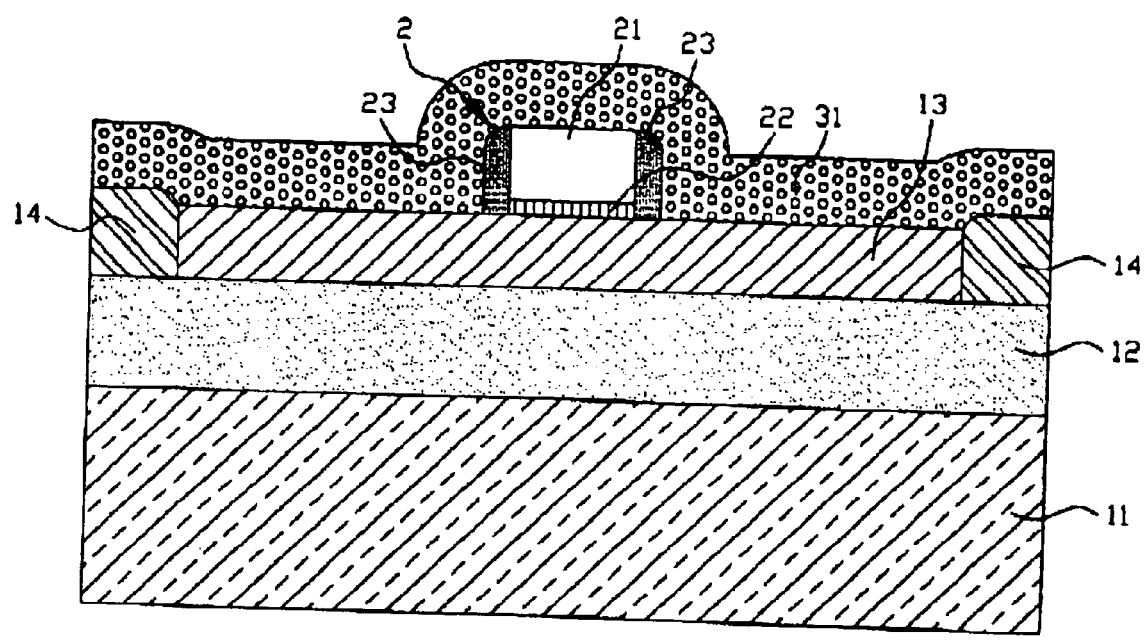
Figure 4:
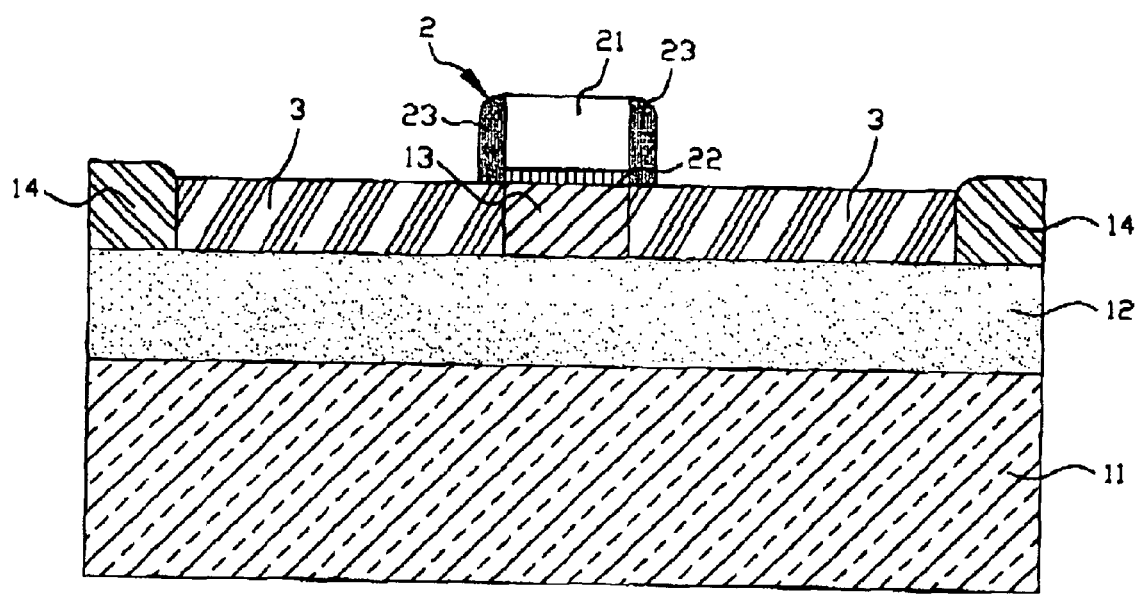
Figure 5:
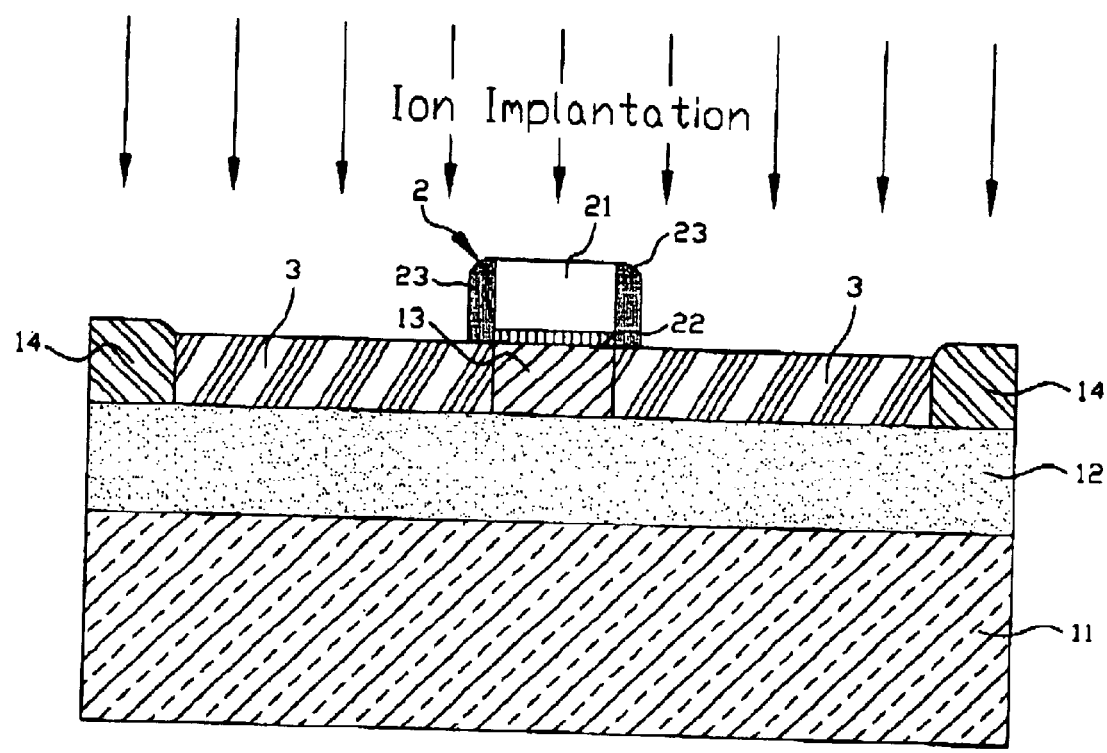
Figure 7:
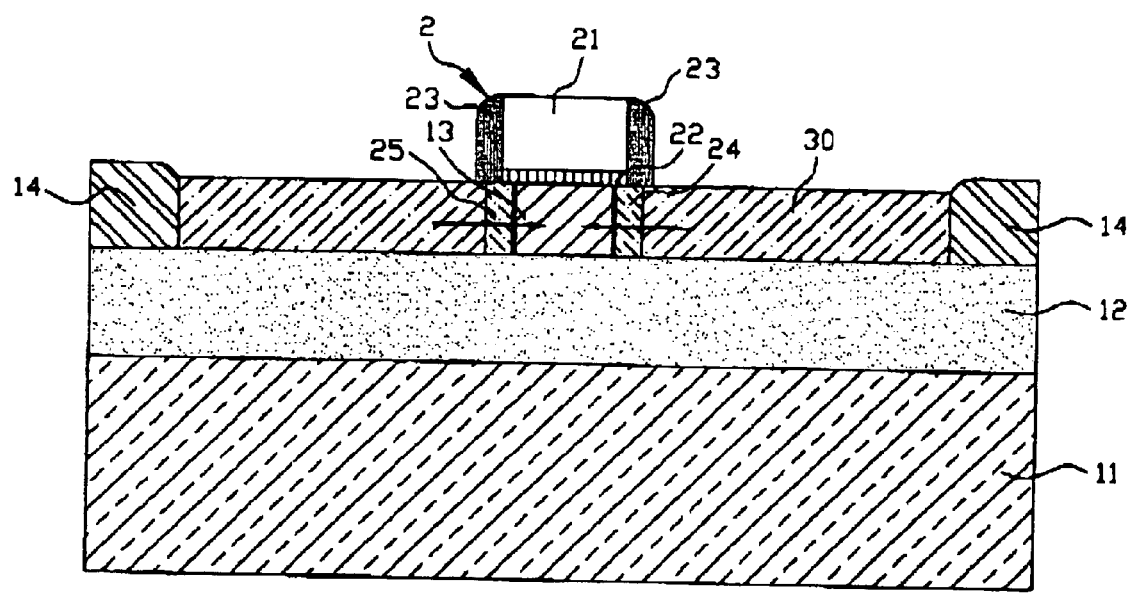

Next, after depositing a metal layer 31, referring to the FIG. 3~FIG. 5, the silicon layer 13 may be reacted by the metal self-aligned silicide process to form a metal-silicide layer 3, and thereby, adapting an implant-to-silicide and annealing process, after forming said metal-silicide layer 3 further comprises the step of annealing process, which is processed after the implant-to-silicide for implanting carriers into said silicide layer processing, a high-density source region and a high-density drain region 24 and 25, as shown in the FIG. 7, are formed for modifying Schottky Barrier and diminishing Carriers Injection Resistance; wherein said MOS 2 further comprises a channel between source electrode and drain electrode for carriers passing through. Because the high-density source and drain regions 24 and 25 forms the modified Schottky Junction, which can solve dramatically the problem of leakage current. Furthermore, the source and the drain regions are completely reacted in metal silicide, therefore, the sheet resistance may be limited. In addition, the present invention adapts the ion-implantation to get the feature of metal silicide, and therefore, the process temperature won't be high, only about 600° C. It is another object of the present invention to provide a low temperature process.

Figure 6:
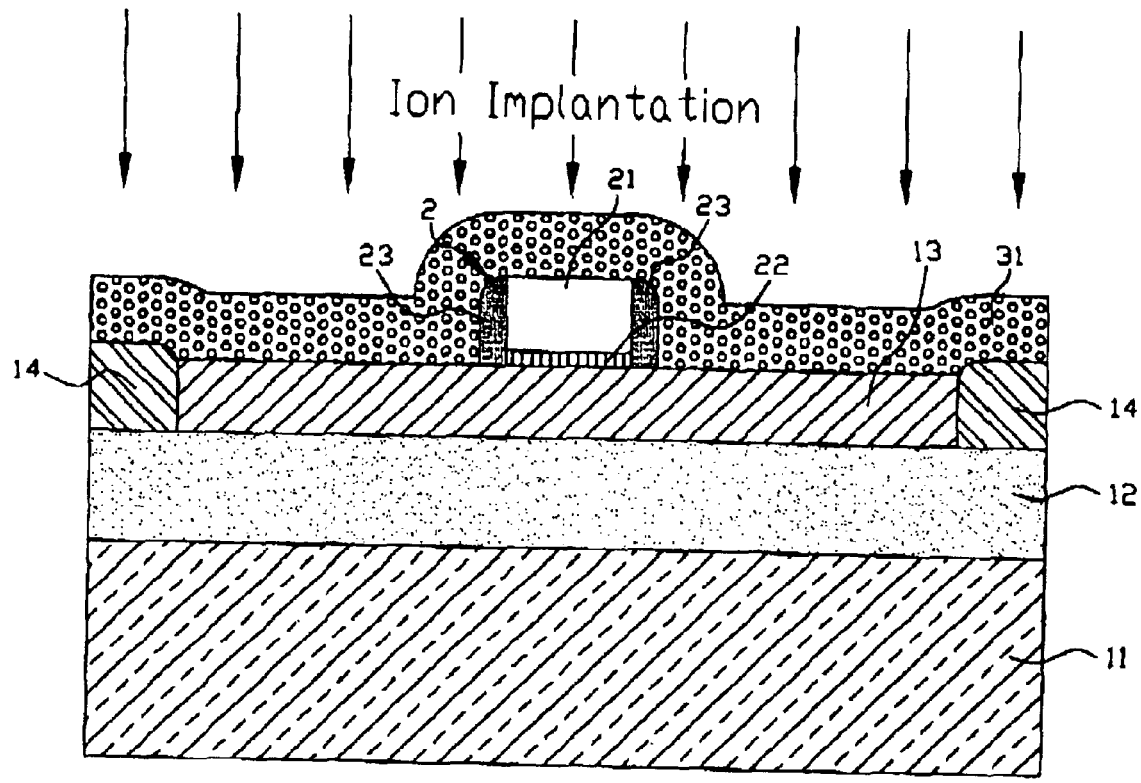

Or, before the self-aligned silicide process in accordance with this invention, the ion implantation will be processed (implant-to-metal) with proper dopant, and then, a high-density source region and a high-density drain region will be formed. That is, referring to the FIG. 1~FIG. 3, a SOI device 1 formed by a SOI process to be the substrate of the present invention. The SOI device 1 includes a substrate 11, an insulation layer 12 formed on said substrate 11, and a silicon layer 13 formed on said insulation layer 12; wherein said substrate 11 may be a silicon substrate or a glass substrate, and said insulation layer 12 may be an oxide layer. Next, please seeing the FIG. 2, the isolation area 14 is formed by a general isolation process. Then the process of dielectric oxidization or deposition, gate deposition, photolithography, and etching forms the gate isolation layer 22 and gate electrode 21. After that, depositing a dielectric isolation layer and adapting an anisotropic etching process, the spacers 23 will be formed. Thus, a MOS 2 is formed on said SOI device 1; wherein said MOS is selected from one of a P-MOS or an N-MOS. After depositing the metal layer 31, then referring to the FIG. 6 and FIG. 7, the ion implantation is processed (implant-to-metal) with proper dopant to form a metal-silicide layer 30 by said metal layer 31 reacting with said silicon layer 3 in accordance with the metal self-aligned process. Therefore, a high-density source region 24 and a high-density drain region 25 are formed for modifying the Schottky Barrier and diminishing Carrier Injection Resistance, as shown in the FIG. 7; wherein said MOS 2 further comprises a channel between source electrode and drain electrode for carriers passing through. Because the high-density source and drain regions 24 and 25 forms the modified Schottky Junction, which can solve the problem of leakage current in drain electrode. Furthermore, the source and the drain are completely reacted In metal silicide, therefore, the sheet resistance may be limited. In addition, the present invention adapts the ion-implantation to get the feature of metal silicide, and therefore, the process temperature won't be high, only about 600° C. It is another object of the present invention to provide a low temperature process.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. A method for fabricating MOSFET for modifying Schottky Barrier and diminishing Carrier Injection Resistance, which comprises the steps of:
   a.) providing a SOI (Silicon-On-Insulator) device, which has a substrate, an insulation layer formed on said substrate, and a silicon layer formed on said insulation layer;
   b.) forming a MOS (Metal Oxide Semiconductor) on said SOI device in accordance with a standard process of semiconductors;
   c.) depositing a metal layer on said SOI device and on said MOS; and
   d.) reacting with said silicon layer to form a metal-silicide layer by a metal self-aligned process, and to form a high-density source region and a high-density drain region by a implant-to-silicide process for modifying Schottky Barrier and diminishing Carrier Injection Resistance.

2. The method of claim 1, wherein the step of reacting with said silicon layer to form a metal-silicide layer by a metal self-aligned process may be changed with the step of implant-to-metal process, which forms a high-density source region and a high-density drain region firsts and then reacts with said silicon layer to form said metal-silicide layer for modifying the Schottky Barrier for diminishing Carrier Injection Resistance.

3. The method of claim 1, after forming said metal-silicide layer further comprises the step of annealing process, wherein the implant-to-silicide for implanting carriers into said silicide layer processing, then processing the step of annealing.

4. The method of claim 1, wherein said MOS is selected from one of P-MOS or N-MOS.

5. The method of claim 1, wherein said MOS further comprises a channel between said source electrode and said drain electrode for carriers passing through.

6. The method of claim 1, wherein said substrate is selected from one of a silicon substrate or a glass substrate.

7. The method of claim 1, wherein said insulation layer is an oxide layer.

* * * * *